(12) United States Patent
Qing et al.

(10) Patent No.: US 9,805,658 B2
(45) Date of Patent: Oct. 31, 2017

(54) SHIFT REGISTER, GATE DRIVING CIRCUIT AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Haigang Qing, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/122,592

(22) PCT Filed: Oct. 20, 2015

(86) PCT No.: PCT/CN2015/092294
§ 371 (c)(1),
(2) Date: Aug. 30, 2016

(87) PCT Pub. No.: WO2016/192267
PCT Pub. Date: Dec. 8, 2016

(65) Prior Publication Data
US 2017/0154565 A1 Jun. 1, 2017

(30) Foreign Application Priority Data
Jun. 1, 2015 (CN) .......................... 2015 1 0291052

(51) Int. Cl.
*G09G 3/32* (2016.01)
*G09G 3/36* (2006.01)
(Continued)

(52) U.S. Cl.
CPC ......... *G09G 3/3266* (2013.01); *G09G 3/3611* (2013.01); *G11C 19/28* (2013.01);
(Continued)

(58) Field of Classification Search
CPC ............... G09G 3/3266; G09G 3/3611; G09G 2310/0286; G11C 19/28; G11C 19/287
See application file for complete search history.

(56) References Cited

U.S. PATENT DOCUMENTS

| 2010/0013823 A1* | 1/2010 | Kwon | G09G 3/3674 345/214 |
| 2011/0150169 A1* | 6/2011 | Lin | G11C 19/28 377/64 |
| 2011/0182399 A1* | 7/2011 | Tobita | G09G 3/3677 377/70 |

FOREIGN PATENT DOCUMENTS

| CN | 103714792 A | 4/2014 |
| CN | 103996367 A | 8/2014 |

(Continued)

OTHER PUBLICATIONS

International Search Report and Written Opinion in PCT/CN2015/092294 dated Feb. 3, 2016, with English translation. 15 pages.
Chinese Office Action with English Language Translation, dated Jan. 3, 2017, Chinese Application No. 201510291052.3.

*Primary Examiner* — Kevin M Nguyen
(74) *Attorney, Agent, or Firm* — Blakely Sokoloff Taylor & Zafman LLP

(57) ABSTRACT

The present disclosure provides a shift register, a gate driving circuit and a display device. The shift register comprises a set/reset unit, a pull down control unit, a pull down unit and an output unit. The set/reset unit sets or resets a pull up node in the output unit in response to a set signal or a reset signal. The output unit outputs an output signal in response to a first control signal through an output terminal of the shift register. The pull down control unit sets a pull (Continued)

down node in the pull down unit in response to a second control signal. The pull down control unit comprises a transistor and a capacitor, and the second control signal is applied to a gate of the transistor through the capacitor.

13 Claims, 6 Drawing Sheets

(51) Int. Cl.
     *G11C 19/28*             (2006.01)
     *G09G 3/3266*          (2016.01)

(52) U.S. Cl.
     CPC ... *G11C 19/287* (2013.01); *G09G 2300/0408* (2013.01); *G09G 2310/0286* (2013.01)

(56) References Cited

FOREIGN PATENT DOCUMENTS

| | | |
|---|---|---|
| CN | 104091572 A | 10/2014 |
| CN | 104318909 A | 1/2015 |
| CN | 104318909 A | 1/2015 |
| CN | 104851383 A | 8/2015 |
| KR | 20010045445 A | 6/2001 |
| KR | 20080000205 A | 1/2008 |
| KR | 20080008800 A | 1/2008 |
| KR | 20140098880 A | 8/2014 |
| TW | 200951937 A | 12/2009 |
| WO | WO 2013026387 A1 | 2/2013 |

\* cited by examiner

SHIFT REGISTER, GATE DRIVING CIRCUIT AND DISPLAY DEVICE

The present application is the U.S. national phase entry of PCT/CN2015/092294, with an international filing date of Oct. 20, 2015, which claims the benefit of Chinese Patent Application No. 201510291052.3, filed on Jun. 1, 2015, the entire disclosure of which is incorporated herein by reference.

TECHNICAL FIELD

The present disclosure relates to the field of display technology particularly to a shift register, a gate driving circuit and a display device.

BACKGROUND

In conventional displays, external driving chips are generally used to drive the pixels on the display panel so as to display the image. However, in order to reduce the number of components and reduce manufacture costs, the technology of manufacturing the structure of the driving circuit on the display panel directly has been adopted gradually nowadays, e.g. the gate driver on array (GOA) technology of integrating the gate driving circuit on the array substrate. In a display panel with the GOA technology, scanning signals are provided by a gate driving circuit consisting of multiple stages of shift registers.

However, the conventional shift register uses diodes in the pull-down control unit to divide the voltage so as to provide a signal for the gate of the transistor, thereby resulting in the problem that the instant current of ground discharge by the high level of one terminal of the diode through the diode is excessively large.

SUMMARY

The present disclosure provides a shift register, a gate driving circuit and a display device, which overcomes the problem of an excessive instant current caused by the method of using diodes to divide the voltage, avoids large discharge current and reduces the power consumption.

According to an aspect of the present disclosure, a shift register is provided, comprising a set/reset unit, a pull down control unit, a pull down unit and an output unit. The set/reset unit sets or resets a pull up node in the output unit in response to a set signal or a reset signal, when the pull up node is set to be in a first level state, the output unit outputs an output signal in response to a first control signal through an output terminal of the shift register. The pull down control unit sets a pull down node in the pull down unit in response to a second control signal, when the pull down node is set to be in the first level state, the pull up node is pulled down to be in a second level state different from the first level state. The pull down control unit comprises a transistor and a capacitor, and the second control signal is applied to a gate of the transistor through the capacitor. When the pull up node is set to be in the first level state, the gate of the transistor of the pull down control unit and the pull down node of the pull down unit are in the second level state.

According to an embodiment of the present disclosure, the output unit can comprise a first transistor and a first capacitor. The first control signal is applied to a drain of the first transistor. A gate of the first transistor and a first terminal of the first capacitor are jointly connected to the pull up node, and a source of the first transistor and a second terminal of the first capacitor are connected to the output terminal of the shift register. The pull down unit can comprise a second transistor, a third transistor, a fifth transistor, a sixth transistor and a second capacitor. A gate of the second transistor, a gate of the third transistor, a drain of the fifth transistor and a first terminal of the second capacitor are jointly connected to the pull down node. A gate of the fifth transistor, a gate of the sixth transistor and a drain of the third transistor are jointly connected to the pull up node. A drain of the second transistor is connected to the output terminal of the shift register. A drain of the sixth transistor is connected to the gate of the transistor of the pull down control unit, and a second terminal of the second capacitor is connected to respective sources of the second transistor, the third transistor, the fifth transistor and the sixth transistor. The transistor of the pull down control unit can be a fourth transistor, and the capacitor of the pull down control unit is a third capacitor. A source of the fourth transistor is connected to the pull down node. The set/reset unit can comprise a seventh transistor and an eighth transistor. The set signal is applied to one of a gate of the seventh transistor and a gate of the eighth transistor. The reset signal is applied to the other of the gate of the seventh transistor and the gate of the eighth transistor.

According to an embodiment of the present disclosure, the first level state can be a high level state. The second level state can be a low level state, and the first to the eighth transistors can be all N-type transistors. A high level signal or the second control signal can be applied to a drain of the fourth transistor, and a low level signal can be applied to the respective sources of the second transistor, the third transistor, the fifth transistor and the sixth transistor. The pull down node is set to be in a high level state and the pull up node is pulled down to be in a low level state when the second control signal is of a high level. A source of the seventh transistor and a drain of the eighth transistor are jointly connected to the pull up node, and a high level signal is applied to a drain of the seventh transistor, while a low level signal is applied to a source of the eighth transistor. Alternatively, the drain of the seventh transistor and the source of the eighth transistor can be jointly connected to the pull up node, and a high level signal can be applied to a drain of the eighth transistor, while a low level signal can be applied to a source of the seventh transistor.

According to another embodiment of the present disclosure, the first level state can be a low level state. The second level state can be a high level state, and the first to the eighth transistors can be all P-type transistors. A low level signal or the second control signal can be applied to a drain of the fourth transistor, and a high level signal can be applied to the respective sources of the second transistor, the third transistor, the fifth transistor and the sixth transistor. The pull down node is set to be in a low level state and the pull up node is pulled down to be in a high level state when the second control signal is of a low level. A drain of the seventh transistor and a source of the eighth transistor can be jointly connected to the pull up node, and a high level signal is applied to a source of the seventh transistor, while a low level signal is applied to a drain of the eighth transistor. Alternatively, the source of the seventh transistor and the drain of the eighth transistor can be jointly connected to the pull up node, and a high level signal is applied to the source of the eighth transistor, while a low level signal is applied to the drain of the seventh transistor.

According to an embodiment of the present disclosure, the output unit can further comprise a ninth transistor of N-type, and a high level signal is applied to a gate of the ninth transistor. The set/reset unit and the pull down unit are connected to the pull up node through the ninth transistor.

According to another embodiment of the present disclosure, the output unit can further comprise a ninth transistor of P-type, and a low level signal is applied to a gate of the ninth transistor. The set/reset unit and the pull down unit are connected to the pull up node through the ninth transistor.

According to another aspect of the present disclosure, a gate driving circuit is provided, comprising n cascaded shift registers according to the present disclosure, then being an integer greater than 1. An output signal of a former-stage of shift register is used as a set signal for a latter-stage of shift register, while an output signal of the latter-stage of shift register is used as a reset signal of the former-stage of shift register, or the output signal of the latter-stage of shift register is used as a set signal of the former-stage of shift register, while the output signal of the former-stage of shift register is used as a reset signal of the latter-stage of shift register.

According to another aspect of the present disclosure, a display device is provided, comprising the gate driving circuit according to the present disclosure.

The shift register, the gate driving circuit and the display device according to the present disclosure can overcome the problem of an excessive instant current caused by the method of using diodes to divide the voltage, avoid large discharge current and reduce the power consumption.

BRIEF DESCRIPTION OF THE DRAWINGS

The above and other aspects, characteristics and other advantages can be understood more clearly through the following detailed description with reference to the drawings, wherein.

DETAILED DESCRIPTION

Next, exemplary embodiments of the concept of the present disclosure will be described in detail with reference to the drawings.

However, the concept of the present disclosure can be exemplified in many different forms, and should not be understood as being limited to the particular embodiments elaborated herein. In addition, these embodiments are provided for enabling this disclosure to be thorough and complete, and conveying the scope of the concept of the present disclosure to the skilled person in the art completely.

Figure 1:
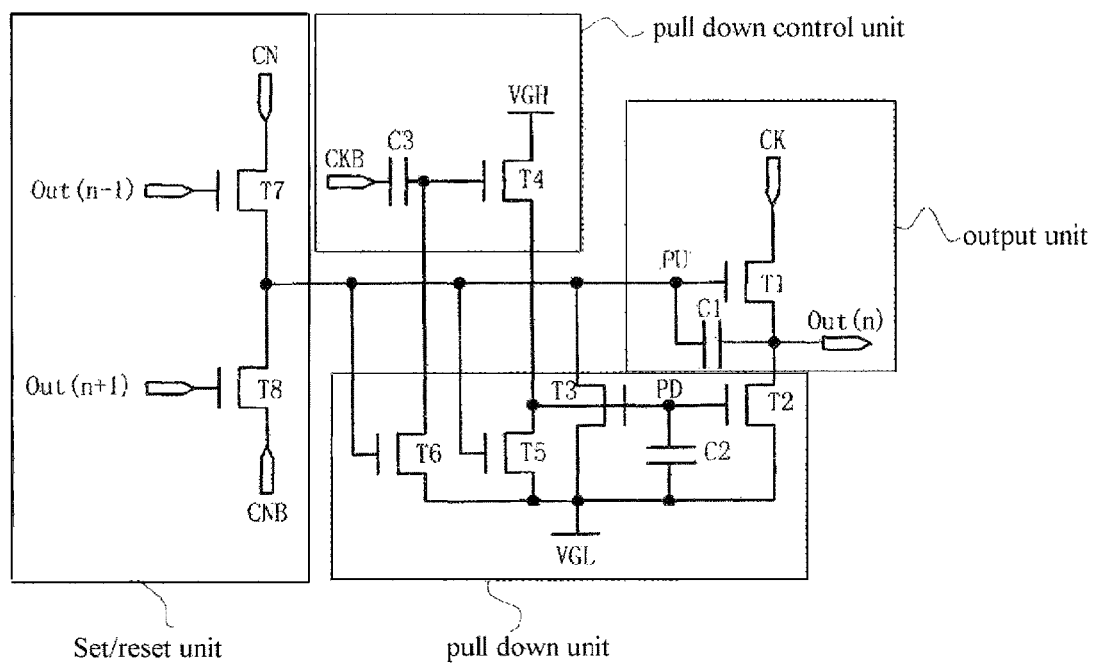
FIG. 1 schematically shows a circuit of a shift register according to an embodiment of the present disclosure.

FIG. 1 schematically shows a circuit of a shift register according to an embodiment of the present disclosure.

As shown in FIG. 1, the shift register according to an embodiment of the present disclosure can comprise a set/reset unit, a pull down control unit, a pull down unit and an output unit.

Figure 7:
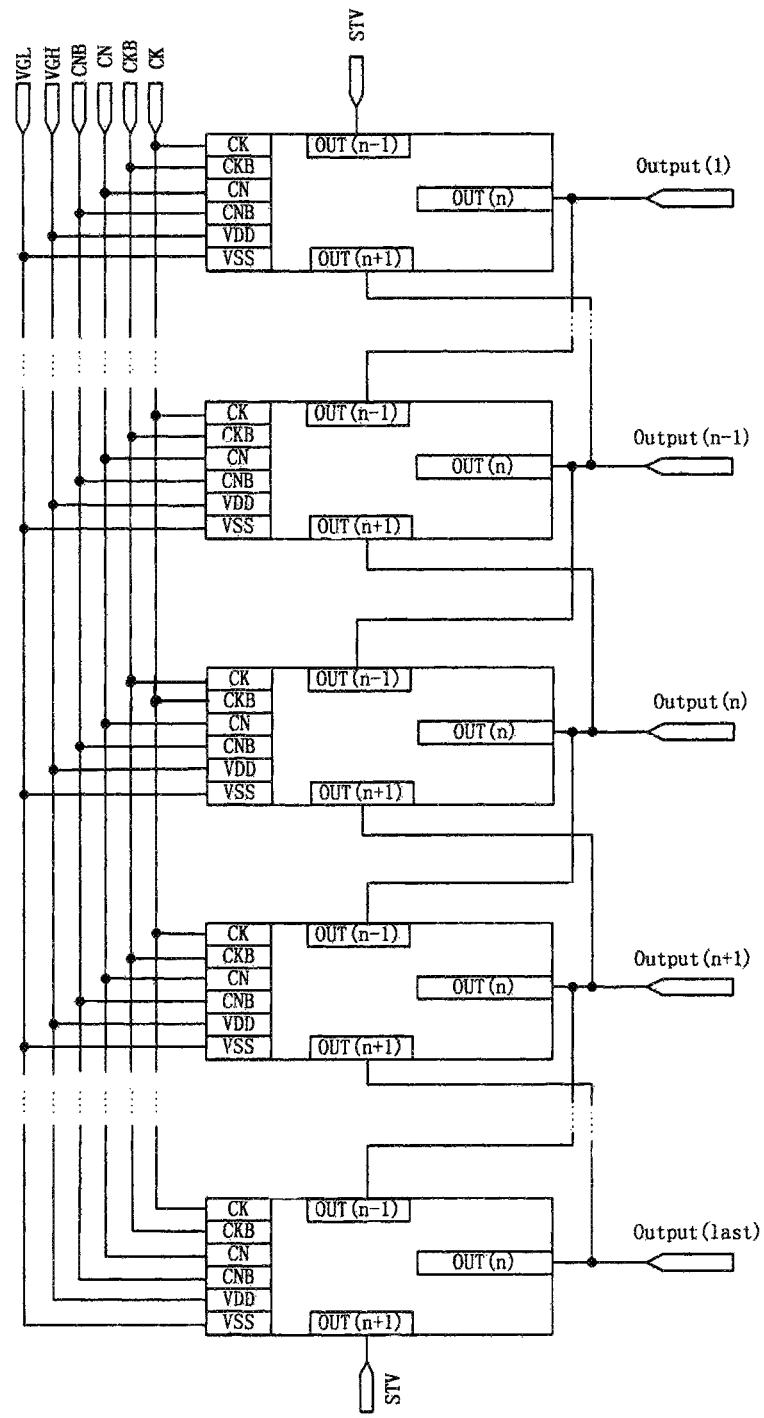
FIG. 7 is a diagram of a gate driving circuit according to an embodiment of the present disclosure.

The set/reset unit sets or resets a pull up node PU in the output unit in response to a set signal or a reset signal. In FIG. 1, the set signal and the reset signal are shown as output signals Out(n−1) and Out(n+1) from a previous stage shift register and a next stage shift register respectively. As shown in FIG. 1, the set/reset unit comprises two transistors T7 and T8. The set signal and the reset signal are applied to the gates of the transistors T7 and T8 respectively. In addition, control signals CN and CNB are applied to sources or drains of the transistors T7 and T8 respectively. One of the two control signals CN and CNB is of high level VGH, and the other is of low level VGL. The selection of the levels of the control signals CN and CNB determines the direction of scanning of the gate driving circuit (as shown in FIG. 7) constituted in cascade. If the CN is of high level and the CNB is of low level, the scanning direction will be a direction from up to down. Take the N-type transistor for example, the source of the transistor T7 and the drain of the transistor T8 can be jointly connected to the pull up node PU, and the high level signal CN can be applied to the drain of the transistor T7, the low level signal CNB can be applied to the source of the transistor T8. If the CN is of low level and the CNB is of high level, the scanning direction will be a direction from down to up. Correspondingly, the drain of the transistor T7 and the source of the transistor T8 can be jointly connected to the pull up node PU, and the high level signal CNB can be applied to the drain of the transistor T8, while the low level signal CN can be applied to the source of the transistor T7. It should be aware that "from up to down" and/or "from down to up" referred here are the directions shown in FIG. 7. When the device in the figure is rotated (e.g., rotated for 180°), the directions as shown in the figure should be explained correspondingly. It can be understood that the connecting directions of the P-type transistor TFT7 and TFT8 are contrary due to different scanning directions, specifically if the CN is of high level and the CNB is of low level, the scanning direction will be a direction from up to down. The drain of the transistor T7 and the source of the transistor T8 can be jointly connected to the pull up node PU, and the high level signal CN can be applied to the source of the transistor T7, while the low level signal CNB can be applied to the drain of the transistor T8. If the CN is of low level and the CNB is of high level, the scanning direction will be a direction from down to up, the source of the transistor T7 and the drain of the transistor T8 can be jointly connected to the pull up node PU, and the high level signal CNB can be applied to the source of the transistor T8, while the low level signal CN can be applied to the drain of the transistor T7.

As shown in FIG. 1, the output unit comprises a transistor T1 and a capacitor C1. A first control signal CK is applied to a drain of the transistor T1. A gate of the transistor T1 and a first terminal of the capacitor C1 are jointly connected to the pull up node PU, and a source of the transistor T1 and a second terminal of the capacitor C1 are connected to an output terminal of the shift register.

When the pull up node PU is set by the set/reset unit so as to be in a first level state (e.g., a high level state), the output unit can output an output signal Out(n) through the output terminal of the shift register in response to the first control signal CK.

A gate of the transistor T2, a gate of the transistor T3, a drain of the transistor T5 and a first terminal of a capacitor C2 are jointly connected to the pull down node PD. A gate of the transistor T5, a gate of the transistor T6 and a drain of the transistor T3 are jointly connected to the pull up node PU. A drain of the transistor T2 is connected to the output terminal of the shift register. A drain of the transistor T6 is connected to a gate of a transistor T4 in the pull down control unit, and a second terminal of the capacitor C2 is connected to respective sources of the transistor T2, the transistor T3, the transistor T5 and the transistor T6.

As shown in FIG. 1, the pull down control unit comprises a transistor T4 and a capacitor C3, and a second control signal CKB is applied to a gate of the transistor T4 through the capacitor C3. A source of the transistor T4 is connected to the pull down node PD.

The pull down control unit can set the pull down node PD in response to the second control signal CKB. When the pull down node PD is set so as to be in a first level state (e.g. a high level state), the pull up node PU can be pulled down to be in a second level state (e.g., a low level state) different from the first level state.

When the pull up node PU is set by the set/reset unit so as to be in a first level state (e.g., a high level state), the gate of the transistor T4 of the pull down control unit and the pull down node PD are in a second level state (e.g., a low level state).

In the pull down control unit, a signal is provided to the gate of the transistor T4 by using the capacitor C3, thereby overcoming the problem that the instant current is excessively large caused by the method of using a diode to split voltage, avoiding large discharge current and reducing the power consumption.

Figure 2:
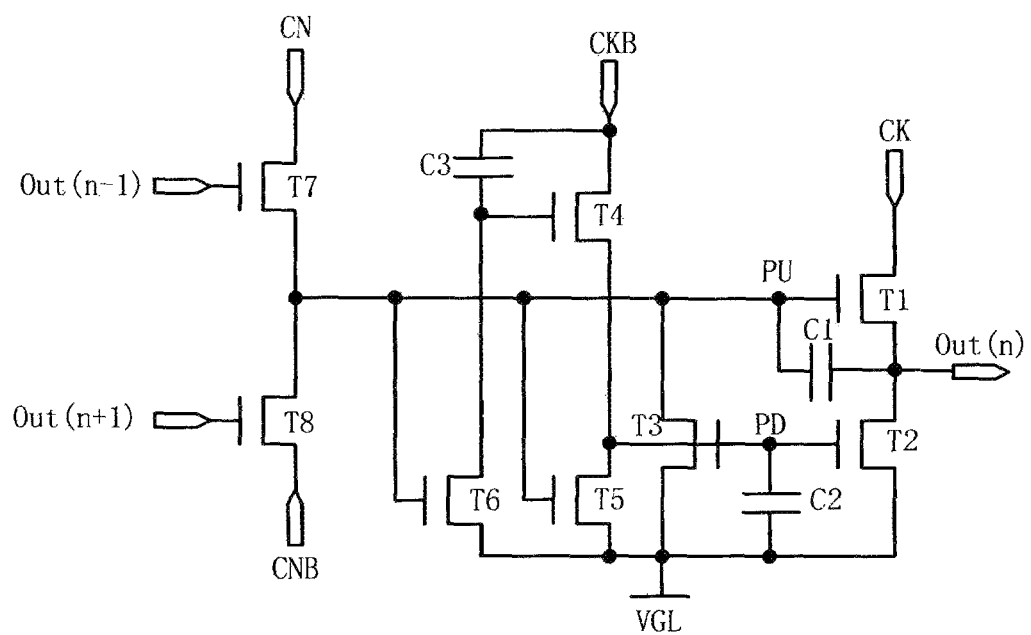
FIG. 2 schematically shows a circuit of a shift register according to another embodiment of the present disclosure.

FIG. 2 schematically shows a circuit of a shift register according to another embodiment of the present disclosure.

The embodiment as shown in FIG. 2 differs from the embodiment as shown in FIG. 1 in that in the circuit of the shift register as shown in FIG. 1, the high level signal VGH is applied to the drain of the transistor T4 of the pull down control unit; in the circuit of the shift register as shown in FIG. 2, the second control signal CKB is applied to the drain of the transistor T4 of the pull down control unit.

The respective transistors T1 to T8 are shown as N-type transistors in FIG. 1 and FIG. 2, and the first level state is a high level state, while the second level state is a low level state. The set/reset unit sets or resets the pull up node PU in response to the high level set signal or reset signal. The output unit outputs an output signal Out(n) through the output terminal of the shift register in response to the high level first control signal CK, and the pull down control unit resets the pull down node PD in response to the high level second control signal CKB. In addition, in FIG. 1 and FIG. 2, the low level signal VGL is applied to respective sources of the transistor T2, the transistor T3, the transistor T5 and the transistor T6. In response to the second control signal CKB being of high level, the high level signal VGH (FIG. 1) or the high level second control signal CKB (FIG. 2) applied to the drain of the transistor T4 can set the pull down node PD to be in a high level state. In response to the pull down node PD being in a high level state, the low level signal VGL applied to the source of the transistor T3 enables the pull up node PU to be pulled down to be in a low level state.

Figure 4:
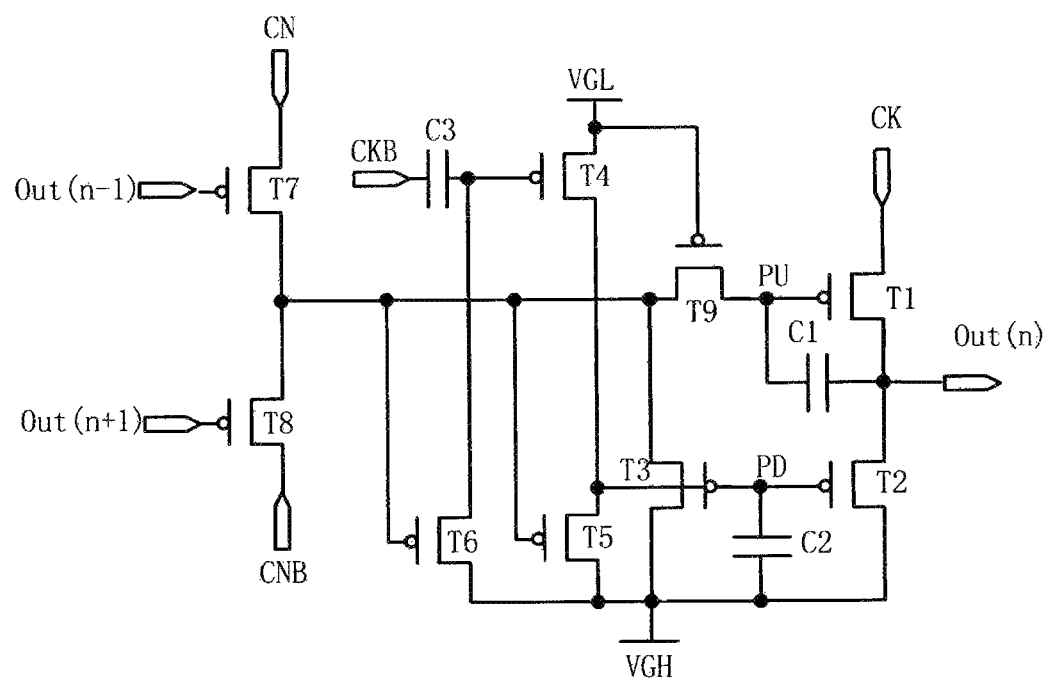
FIG. 4 schematically shows a circuit of a shift register according to another embodiment of the present disclosure.

However, the skilled person in the art should be clear that the respective transistors T1 to T8 can also be P-type transistors (as shown in FIG. 4), and the first level state can be a low level state, while the second level state can be a high level state. In such a case, the set/reset unit sets or resets the pull up node PU in response to the low level set signal or reset signal. The output unit outputs the output signal Out(n) through the output terminal of the shift register in response to the low level first control signal CK, and the pull down control unit sets the pull down node PD in response to the low level second control signal CKB. Hence, a low level signal can be applied to the drain of the transistor T4 of the pull down control unit, and a high level signal can be applied to respective sources of the transistor T2, the transistor T3, the transistor T5 and the transistor T6. In response to the second control signal CKB being of low level, the low level signal or the low level second control signal CKB applied to the drain of the transistor T4 can set the pull down node PD to be in a low level state. In response to the pull down node PD being in a low level state, the high level signal applied to the source of the transistor T3 enables the pull up node PU to be pulled down to be in a high level state.

Next, the working principle of the circuit of the shift register according the present disclosure will be explained briefly by taking the embodiment as shown in FIG. 1 as the example.

Figure 5:
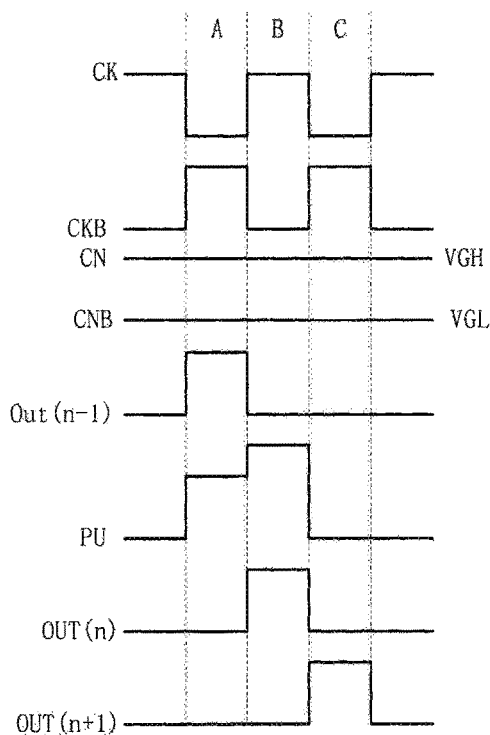
FIG. 5 is a signal timing diagram of the shift register as shown in FIG. 1 to FIG. 3.

FIG. 5 is a signal timing diagram of the shift register as shown in FIG. 1.

Referring to FIG. 1 and FIG. 5, the first control signal CK and the second control signal CKB are complementary square wave signals with a duty ratio of 50%. The control signal CN is of high level VGH, and the control signal CNB is of low level VGL, i.e., the scanning direction of the gate driving cascaded by the shift register as shown in FIG. 1 is a direction "from up to down".

In the input phase (the phase A as shown in FIG. 5), an output signal (i.e., a set signal) Out(n−1) of a previous-stage shift register and the second control signal CKB are of high level VGH. An output signal (i.e., a reset signal) Out(n+1) of a next-stage shift register and the first control signal CK are of low level VGL. In such a case, the transistor T7 is turned on, while the transistor T8 is turned off. The high level VGH of the control signal CN charges the capacitor C1 through the transistor T7, thereby setting the pull up node PU to be in a high level state (i.e., a first level state). In response to the pull up node PU being in a high level state, transistors T5 and T6 are turned on to enable the gate of the transistor T4 of the pull down control unit to be pulled down to the low level VGL, i.e., the gate of the transistor T4 of the pull down control unit is in a low level state (i.e., a second level state), thus the transistor T4 is turned off. In addition, the pull down node PD discharges the capacitor C2 through the transistor T5, to enable the pull down node PD to be pulled down to the low level VGL, i.e., the pull down node PD is in a low level state (i.e., a second level state), thus the transistors T2 and T3 are turned off. The first control signal CK is of low level VGL and enables the transistor T1 to be turned on because the pull up node PU is in the high level state; thus the output signal Out(n) outputted by the output terminal of the shift register is pulled down to the low level VGL by the first control signal CK through the transistor T1.

In the output phase (the phase B as shown in FIG. 5), the output signal Out(n−1) of the previous-stage shift register, the output signal Out(n+1) of the next-stage shift register and the second control signal CKB are all of low level VGL; thus, the transistors T7, T8 and T4 are all turned off. The pull up node PU has no discharge path, as a result, it is kept at high level VGH; thereby, the transistors T1, T5 and T6 are kept to be turned on, and the pull down node PD is kept in a low level state. Because the transistor T1 is turned on, the output signal Out(n) outputted by the output terminal of the shift register is pulled up to the high level VGH by the first control signal CK through the transistor T1. In addition, the pull up node PU is coupled to a higher voltage through the capacitor C1 and the transistor T1, so as to increase the charging current.

In the reset phase (the phase C as shown in FIG. 5), the output signal (i.e., the reset signal) Out(n+1) of the next-stage shift register and the second control signal CKB are of high level VGH. The output signal (i.e., the set signal) Out(n−1) of the previous-stage shift register and the first control signal CK are of low level VGL. In such a case, the transistor T8 is turned on, while the transistor T7 is turned off. The pull up node PU discharges through the path formed by transistor T8, so as to reset the pull up node PU to be in a low level state (i.e., the second level state). In response to the pull up node PU being in a low level state, the transistors T1, T5 and T6 are turned off. Because the transistor T6 is turned off, the jump of the second control signal CKB from a low level to a high level couples the gate of the transistor T4 to a high level through the capacitor C3, so as to turn on the transistor T4. The high level VGH charges the capacitor C2 through the transistor T4, so as to set the pull down node PD to a high level. In response to the pull down node PD being in a high level state, the transistors T2 and T3 are turned on, so that the output signal Out(n) outputted by the output terminal of the shift register is pulled down to a low level VGL through the transistor T2.

Within other time periods except for the phases A to C within one frame, the first control signal CK is changed to a high level VGH periodically while the second control signal CKB is changed to a low level VGL periodically. The pull down node PD is kept in a high level state, so as to restrain noise accumulation at the pull up node PU and the output terminal of the shift register, thereby ensuring normal operations of the shift register.

Figure 3:
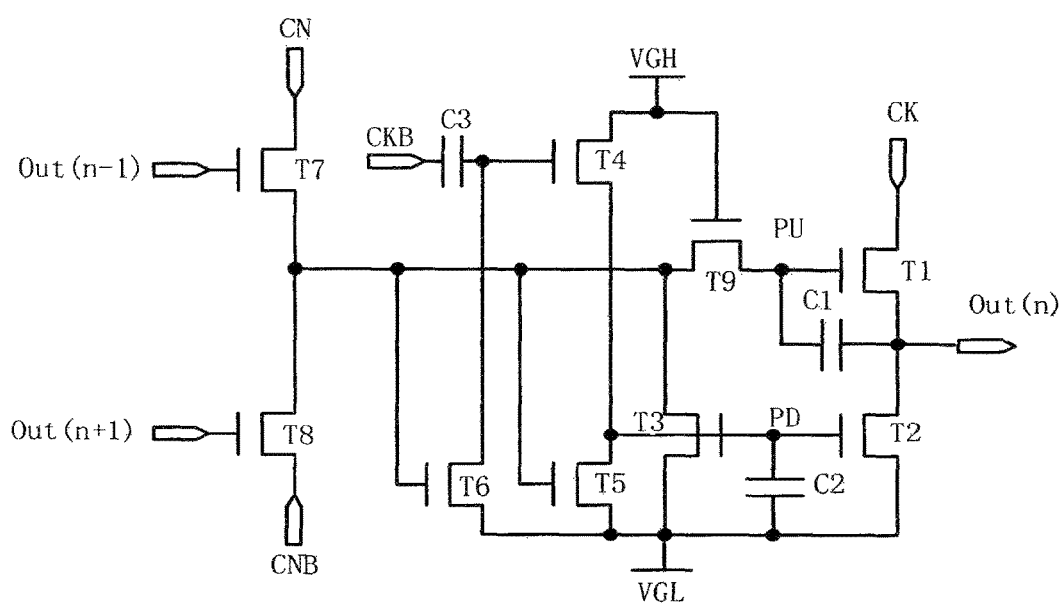
FIG. 3 schematically shows a circuit of a shift register according to another embodiment of the present disclosure.
Figure 6:
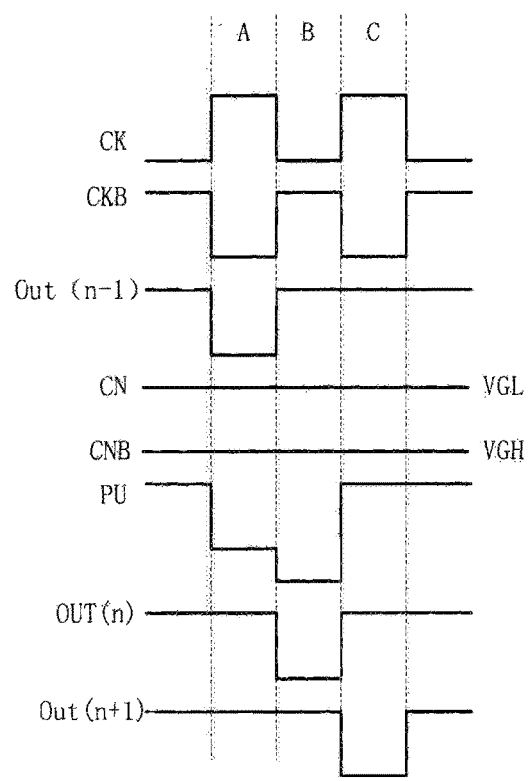
FIG. 6 is a signal timing diagram of the shift register as shown in FIG. 4.

FIG. 3 and FIG. 4 schematically show a circuit of a shift register according to another embodiment of the present disclosure, and FIG. 6 is a signal timing diagram of the shift register as shown in FIG. 4. FIG. 3 shows the respective transistors to be N-type transistors, while FIG. 4 shows the respective transistors to be P-type transistors. Therefore, only the circuit of the shift register as shown in FIG. 3 will be explained in the following, while the difference caused by N-type transistors and P-type transistors will not be repeated any more. In addition, except for the exchange of the setting manners of the high level and the low level, the work flow of the shift register as shown in FIG. 6 is essentially the same as that described with reference to FIG. 5, thus it will not be repeated.

The embodiment as shown in FIG. 3 differs from the embodiment as shown in FIG. 1 in that in the circuit of the shift register as shown in FIG. 3, the output unit further comprises an N-type transistor T9, and a high level signal is applied to a gate of the transistor T9. The set/reset unit and the pull down unit are connected to the pull up node PU through the transistor T9. Because the transistor T9 is introduced, during the output phase B, when the pull up node PU is of a higher level (greater than VGH), the transistor T9 can play the role of current limiting and clamping to the capacitor C1.

FIG. 7 is a diagram of a gate driving circuit according to an embodiment of the present disclosure.

The gate driving circuit as shown in FIG. 7 comprises a plurality of cascaded shift registers. The shift register can be one of the shift registers described in FIG. 1 to FIG. 6 or an equivalent modification thereof. Take the N-type transistor as an example, when CN is of high level while CNB is of low level, an output signal of a former-stage of shift register is used as a set signal for a latter-stage of shift register, while an output signal of the latter-stage of shift register is used as a reset signal of the former-stage of shift register. When CN is of low level while CNB is of high level, the output signal of the latter-stage of shift register is used as a set signal of the former-stage of shift register, while the output signal of the former-stage of shift register is used as a reset signal of the latter-stage of shift register. In addition, a dedicated STV signal is provided for the cascaded first shift register and the last shift register so as to be used as a set signal and/or a reset signal.

The complementary square wave signals with a duty ratio of 50% are used as a first control signal and a second control signal of respective shift registers respectively. The first control signal and the second control signal between two adjacent shift registers are opposite to each other. For example, if the signal CK is used as the first control signal of the kth shift register while the signal CKB is used as the second control signal of the kth shift register, the signal CKB will be used as the first control signal of the k+1th shift register while the signal CK will be used as the second control signal of the k+1th shift register.

Although the respective exemplary embodiments have been shown and explained, the ordinary skilled person in the art should understand that various modifications in terms of forms and details can be made to these exemplary embodiments without departing from the spirit and the scope of the concept of the present disclosure defined by the Claims attached.

The invention claimed is:

1. A shift register, comprising a set/reset unit, a pull down control unit, a pull down unit and an output unit,
   wherein the set/reset unit sets or resets a pull up node in the output unit in response to a set signal or a reset signal, when the pull up node is set to be in a first level state, the output unit outputs an output signal in response to a first control signal through an output terminal of the shift register, and
   wherein the pull down control unit sets a pull down node in the pull down unit in response to a second control signal, when the pull down node is set to be in the first level state, the pull up node is pulled down to be in a second level state different from the first level state,
   the pull down control unit comprises a transistor and a capacitor, and the second control signal is applied to a gate of the transistor through the capacitor,
   when the pull up node is set to be in the first level state, the gate of the transistor of the pull down control unit and the pull down node of the pull down unit are in the second level state.

2. The shift register according to claim 1, wherein
   the output unit comprises a first transistor and a first capacitor, the first control signal is applied to a drain of the first transistor, a gate of the first transistor and a first terminal of the first capacitor are jointly connected to the pull up node, and a source of the first transistor and a second terminal of the first capacitor are connected to the output terminal of the shift register,
   the pull down unit comprises a second transistor, a third transistor, a fifth transistor, a sixth transistor and a second capacitor, a gate of the second transistor, a gate of the third transistor, a drain of the fifth transistor and a first terminal of the second capacitor are jointly connected to the pull down node, a gate of the fifth transistor, a gate of the sixth transistor and a drain of the third transistor are jointly connected to the pull up node, a drain of the second transistor is connected to the output terminal of the shift register, a drain of the sixth transistor is connected to the gate of the transistor of the pull down control unit, and a second terminal of the second capacitor is connected to respective sources of the second transistor, the third transistor, the fifth transistor and the sixth transistor, the transistor of the pull down control unit is a fourth transistor, and the capacitor of the pull down control unit is a third capacitor, a source of the fourth transistor is connected to the pull down node, the set/reset unit comprises a seventh transistor and an eighth transistor, the set signal is applied to one of a gate of the seventh transistor and a gate of the eighth transistor, the reset signal is applied to the other of the gate of the seventh transistor and the gate of the eighth transistor.

3. The shift register according to claim 2, wherein the first level state is a high level state, the second level state is a low level state, and the first to the eighth transistors are all N-type transistors, wherein a high level signal or the second control signal is applied to a drain of the fourth transistor, a low level signal is applied to the respective sources of the second transistor, the third transistor, the fifth transistor and the sixth transistor, and wherein the pull down node is set to be in a high level state and the pull up node is pulled down to be in a low level state when the second control signal is of a high level, a source of the seventh transistor and a drain of the eighth transistor are jointly connected to the pull up node, and a high level signal is applied to a drain of the seventh transistor, a low level signal is applied to a source of the eighth transistor; or the drain of the seventh transistor and the source of the eighth transistor are jointly connected to the pull up node, and a high level signal is applied to a drain of the eighth transistor, a low level signal is applied to a source of the seventh transistor.

4. The shift register according to claim 2, wherein the first level state is a low level state, the second level state is a high level state, and the first to the eighth transistors are all P-type transistors, wherein a low level signal or the second control signal is applied to a drain of the fourth transistor, a high level signal is applied to the respective sources of the second transistor, the third transistor, the fifth transistor and the sixth transistor, and wherein the pull down node is set to be in a low level state and the pull up node is pulled down to be in a high level state when the second control signal is of a low level, a drain of the seventh transistor and a source of the eighth transistor are jointly connected to the pull up node, and a high level signal is applied to a source of the seventh transistor, a low level signal is applied to a drain of the eighth transistor; or the source of the seventh transistor and the drain of the eighth transistor are jointly connected to the pull up node, and a high level signal is applied to the source of the eighth transistor, a low level signal is applied to the drain of the seventh transistor.

5. The shift register according to claim 3, wherein the output unit further comprises a ninth transistor of N-type, and a high level signal is applied to a gate of the ninth transistor, the set/reset unit and the pull down unit are connected to the pull up node through the ninth transistor.

6. The shift register according to claim 4, wherein the output unit further comprises a ninth transistor of P-type, and a low level signal is applied to a gate of the ninth transistor, the set/reset unit and the pull down unit are connected to the pull up node through the ninth transistor.

7. A gate driving circuit, comprising n cascaded shift registers according to claim 1, the n being an integer greater than 1, wherein an output signal of a former-stage of shift register is used as a set signal for a latter-stage of shift register, while an output signal of the latter-stage of shift register is used as a reset signal of the former-stage of shift register, or the output signal of the latter-stage of shift register is used as a set signal of the former-stage of shift register, while the output signal of the former-stage of shift register is used as a reset signal of the latter-stage of shift register.

8. A display device, comprising the gate driving circuit according to claim 7.

9. The gate driving circuit according to claim 7, wherein the output unit comprises a first transistor and a first capacitor, the first control signal is applied to a drain of the first transistor, a gate of the first transistor and a first terminal of the first capacitor are jointly connected to the pull up node, and a source of the first transistor and a second terminal of the first capacitor are connected to the output terminal of the shift register, the pull down unit comprises a second transistor, a third transistor, a fifth transistor, a sixth transistor and a second capacitor, a gate of the second transistor, a gate of the third transistor, a drain of the fifth transistor and a first terminal of the second capacitor are jointly connected to the pull down node, a gate of the fifth transistor, a gate of the sixth transistor and a drain of the third transistor are jointly connected to the pull up node, a drain of the second transistor is connected to the output terminal of the shift register, a drain of the sixth transistor is connected to the gate of the transistor of the pull down control unit, and a second terminal of the second capacitor is connected to respective sources of the second transistor, the third transistor, the fifth transistor and the sixth transistor, the transistor of the pull down control unit is a fourth transistor, and the capacitor of the pull down control unit is a third capacitor, a source of the fourth transistor is connected to the pull down node, the set/reset unit comprises a seventh transistor and an eighth transistor, the set signal is applied to one of a gate of the seventh transistor and a gate of the eighth transistor, the reset signal is applied to the other of the gate of the seventh transistor and the gate of the eighth transistor.

10. The gate driving circuit according to claim 9, wherein the first level state is a high level state, the second level state is a low level state, and the first to the eighth transistors are all N-type transistors, wherein a high level signal or the second control signal is applied to a drain of the fourth transistor, a low level signal is applied to the respective sources of the second transistor, the third transistor, the fifth transistor and the sixth transistor, and wherein the pull down node is set to be in a high level state and the pull up node is pulled down to be in a low level state when the second control signal is of a high level, a source of the seventh transistor and a drain of the eighth transistor are jointly connected to the pull up node, and a high level signal is applied to a drain of the seventh transistor, a low level signal is applied to a source of the eighth transistor; or the drain of the seventh transistor and the source of the eighth transistor are jointly connected to the pull up node, and a high level signal is applied to a drain of the eighth transistor, a low level signal is applied to a source of the seventh transistor.

11. The gate driving circuit according to claim 9, wherein
the first level state is a low level state, the second level state is a high level state, and the first to the eighth transistors are all P-type transistors, wherein a low level signal or the second control signal is applied to a drain of the fourth transistor, a high level signal is applied to the respective sources of the second transistor, the third transistor, the fifth transistor and the sixth transistor, and wherein the pull down node is set to be in a low level state and the pull up node is pulled down to be in a high level state when the second control signal is of a low level, a drain of the seventh transistor and a source of the eighth transistor are jointly connected to the pull up node, and a high level signal is applied to a source of the seventh transistor, a low level signal is applied to a drain of the eighth transistor; or the source of the seventh transistor and the drain of the eighth transistor are jointly connected to the pull up node, and a high level signal is applied to the source of the eighth transistor, a low level signal is applied to the drain of the seventh transistor.

12. The gate driving circuit according to claim 10, wherein
the output unit further comprises a ninth transistor of N-type, and a high level signal is applied to a gate of the ninth transistor, the set/reset unit and the pull down unit are connected to the pull up node through the ninth transistor.

13. The gate driving circuit according to claim 11, wherein
the output unit further comprises a ninth transistor of P-type, and a low level signal is applied to a gate of the ninth transistor, the set/reset unit and the pull down unit are connected to the pull up node through the ninth transistor.

* * * * *